(12) United States Patent
Pu et al.

(10) Patent No.: US 8,420,452 B2
(45) Date of Patent: Apr. 16, 2013

(54) FABRICATION METHOD OF LEADFRAME-BASED SEMICONDUCTOR PACKAGE

(75) Inventors: Han-Ping Pu, Taichung (TW); Chien-Ping Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/214,076

(22) Filed: Aug. 19, 2011

(65) Prior Publication Data
US 2011/0300671 A1    Dec. 8, 2011

Related U.S. Application Data

(62) Division of application No. 11/523,719, filed on Sep. 20, 2006, now abandoned.

(30) Foreign Application Priority Data

Sep. 20, 2005   (TW) .............................. 94132399 A (51) Int. Cl.
*H01L 21/4825*   (2006.01)

(52) U.S. Cl.
USPC ........... 438/128; 438/129; 257/737; 257/738; 257/773

(58) Field of Classification Search .......... 257/666–677, 257/E23.031, 773, 737, 738; 438/128, 129
See application file for complete search history.

(56) References Cited

U.S. PATENT DOCUMENTS

6,686,268 B2   2/2004   Farnworth
7,138,707 B1   11/2006  Lee et al.
2004/0089921 A1   5/2004  Minamio et al.

*Primary Examiner* — Eva Yan Montalvo
(74) *Attorney, Agent, or Firm* — Birch, Stewart, Kolasch & Birch, LLP (57) ABSTRACT

A leadframe-based semiconductor package and a fabrication method thereof are provided. The leadframe-based semiconductor package includes a chip implanted with a plurality of first and second conductive bumps thereon, and a leadframe having a plurality of leads. The first conductive bumps are bonded to the leads to electrically connect the chip to the leadframe. The chip, the first and second conductive bumps, and the leadframe are encapsulated by an encapsulant, with bottom ends of the second conductive bumps and bottom surfaces of the leads being exposed from the encapsulant. This allows the second conductive bumps to provide additional input/output electrical connections for the chip besides the leads.

9 Claims, 6 Drawing Sheets

FABRICATION METHOD OF LEADFRAME-BASED SEMICONDUCTOR PACKAGE

CROSS REFERENCE TO RELATED APPLICATIONS:

This application is a Divisional of application Ser. No. 11/523,719 filed on Sep. 20, 2006 now abandoned, which claims priority to application No. 094132399 filed in Taiwan, on Sep. 20, 2005. The entire contents of all of the above applications is hereby incorporated by reference.

FIELD OF THE INVENTION

The present invention relates to semiconductor packages and fabrication methods thereof, and more particularly, to a leadframe-based flip-chip type semiconductor package and a method of fabricating the semiconductor package.

BACKGROUND OF THE INVENTION

Conventionally, a semiconductor package using a leadframe as a chip carrier, which is referred to as a leadframe-based semiconductor package, is formed by attaching a non-active surface of a semiconductor chip to a die pad of the leadframe, electrically connecting the semiconductor chip to a plurality of leads of the leadframe via a plurality of bonding wires, and forming an encapsulant to encapsulate the semiconductor chip, the bonding wires and a part of the leadframe. However, this type of semiconductor package usually encounters problems that, for example, electronic signals become weakened due to the length of the bonding wires, and during a molding process of forming the encapsulant, wire loops of the bonding wires tend to be swept or sagged due to impact of mold flow of an encapsulating resin, thereby leading to undesirable contact and short circuit between adjacent bonding wires. Moreover, the leadframe-based semiconductor package cannot be further reduced in thickness as the height of the wire loops of the bonding wires must be considered.

Accordingly, there has been proposed another leadframe-based semiconductor package using a flip-chip technology. In this semiconductor package, a semiconductor chip is mounted on a leadframe in an upside-down manner that a plurality of conductive bumps implanted to an active surface of the semiconductor chip are bonded and electrically connected to corresponding leads of the leadframe. Consequently, without the use of bonding wires, a path for transmitting electronic signals in the semiconductor package is shortened through the conductive bumps and the quality of electronic signals during transmission is not adversely affected, and further, the semiconductor package can be effectively reduced in height as not having to consider the loop height of the bonding wires.

However, in the above leadframe-based flip-chip type semiconductor package, the leads of the leadframe are disposed at a peripheral portion of the leadframe, and there is no electrical connection provided at a central portion of the leadframe, such that an issue of not having a sufficient number of electrical connections may arise.

Figure 1A:
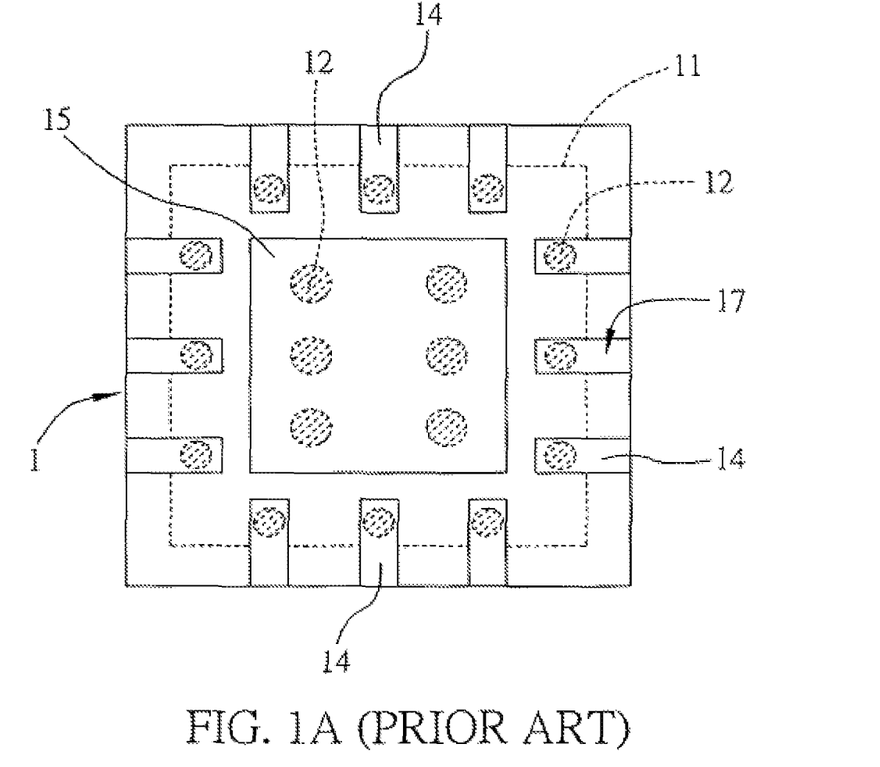
FIG. 1A (PRIOR ART) is a plane view of a leadframe-based semiconductor package disclosed by U.S. Pat. No. 6,815,833.
Figure 1B:
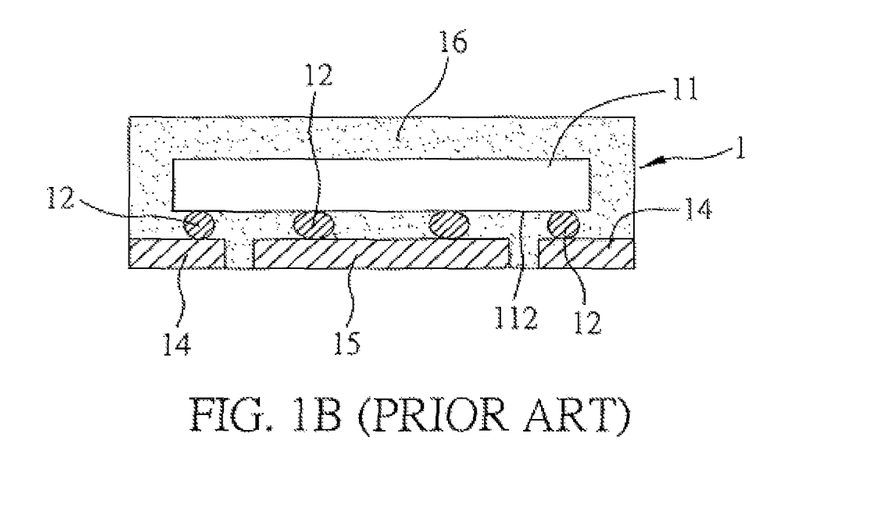
FIG. 1B (PRIOR ART) is a cross-sectional view of the leadframe-based semiconductor package disclosed by U.S. Pat. No. 6,815,833.

In order to solve the aforementioned problem, U.S. Pat. No. 6,815,833 proposes a semiconductor package 1 having electrical connections formed at a central portion of a leadframe. As shown in FIGS. 1A and 1B, the semiconductor package 1 comprises: a leadframe 17 having a plurality of leads 14 and a die pad 15; a semiconductor chip 11 having an active surface 112, the semiconductor chip 11 being mounted and electrically connected to the die pad 15 and the leads 14 of the leadframe 17 by a plurality of conductive bumps 12 formed on the active surface 112 of the semiconductor chip 11; and an encapsulant 16 for encapsulating a part of the leadframe 17, the conductive bumps 12 and the semiconductor chip 11, wherein bottom surfaces of the leads 14 and the die pad 15 are exposed from the encapsulant 16. By this arrangement, the leads 14 of the leadframe 17 serve as input/output (I/O) connections, and the die pad 15 of the leadframe 17 serves as, for example, an additional power or grounding connection.

Figure 2A:
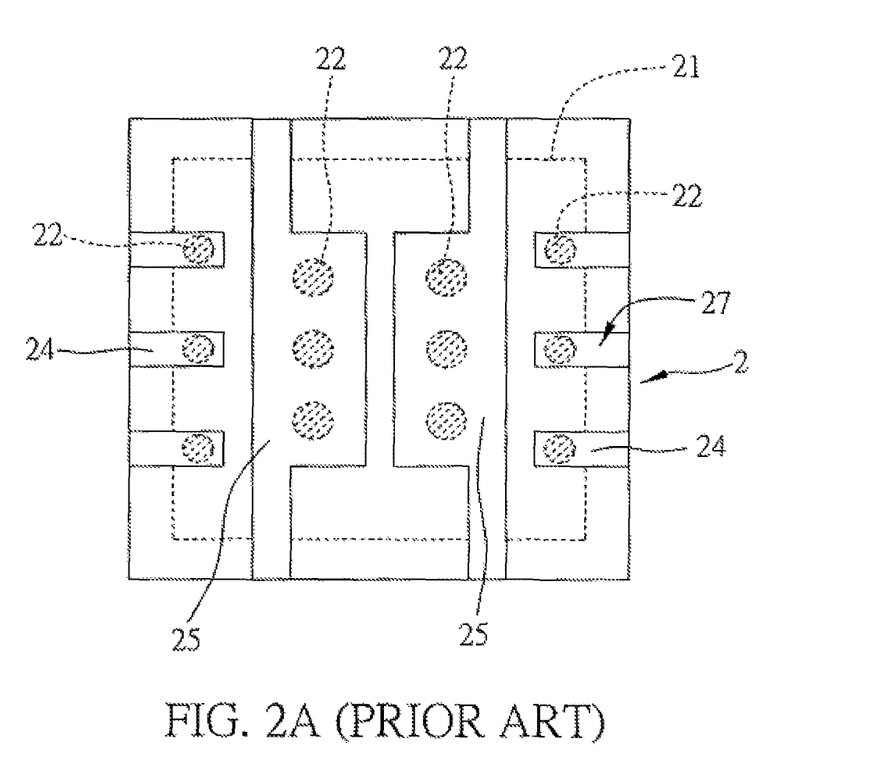
FIG. 2A (PRIOR ART) is a plane view of a leadframe-based semiconductor package disclosed by U.S. Pat. No. 6,597,059.
Figure 2B:
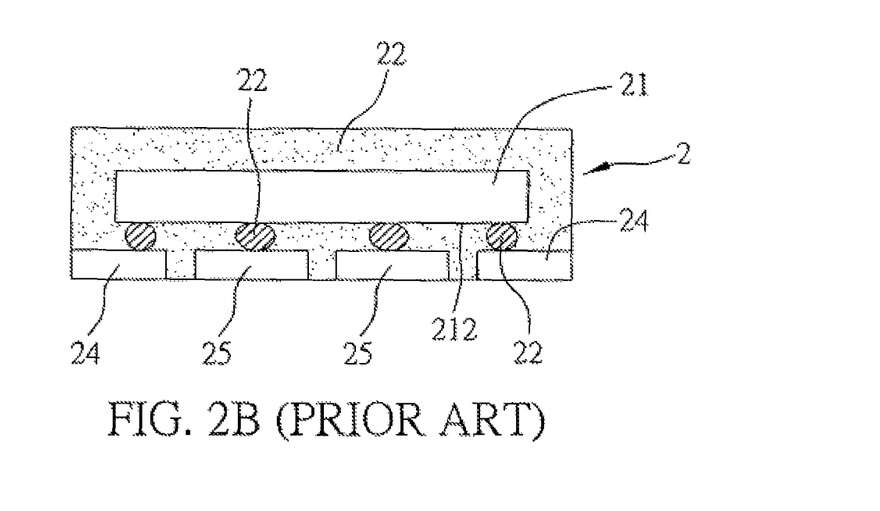
FIG. 2B (PRIOR ART) is a cross-sectional view of the leadframe-based semiconductor package disclosed by U.S. Pat. No. 6,597,059.

U.S. Pat. No. 6,597,059 also proposes a semiconductor package 2 with an increased number of electrical connections. As shown in FIGS. 2A and 2B, the semiconductor package 2 comprises: a leadframe 27 having a plurality of leads 24 and two die pads 25; a semiconductor chip 21 having an active surface 212, the semiconductor chip 21 being electrically connected to the corresponding leads 24 and the two die pads 25 by a plurality of conductive bumps 22 formed on the active surface 212 of the semiconductor chip 21; and an encapsulant 26 for encapsulating a part of the leadframe 27, the conductive bumps 22 and the semiconductor chip 21, wherein bottom surfaces of the leads 24 and the die pads 25 are exposed from the encapsulant 26. By such arrangement, the leads 24 of the leadframe 27 serve as I/O connections, and the two die pads 25 of the leadframe 27 serve as, for example, two additional power and/or grounding connections.

Although in the above-mentioned packages, it seems beneficial of having the die pad(s) provide one or two additional electrical connections besides the leads of the lead frame, the die pad(s) may only serve as power or grounding connection(s) but not I/O connection(s) because a plurality of conductive bumps are electrically connected thereto, such that this arrangement still does not fulfill the need of sufficient I/O connections for a highly integrated semiconductor chip with high electrical performance and multi-functionality. Therefore, the problem to be solved here is to provide a semiconductor package with an increased number of I/O connections so as to enhance the electrical performance of the semiconductor package.

SUMMARY OF THE INVENTION

In view of the foregoing drawbacks of the prior art, a primary objective of the present invention is to provide a leadframe-based semiconductor package and a fabrication method thereof, which can increase the number of I/O connections of the semiconductor package.

Another objective of the present invention is to provide a leadframe-based semiconductor package and a fabrication method thereof, which can enhance the heat dissipating efficiency, improve the electrical performance and increase the number of I/O connections of the semiconductor package.

In order to achieve the foregoing and other objectives, the present invention proposes a leadframe-based semiconductor package, comprising: a leadframe having a plurality of leads; a chip mounted on the leadframe, wherein the chip has an active surface defined with a first region and a second region surrounded by the first region; a plurality of first conductive bumps implanted to the first region of the active surface of the chip, for electrically connecting the chip to the leads of the leadframe; a plurality of second conductive bumps implanted to the second region of the active surface of the chip, for electrically connecting the chip directly to an external device; and an encapsulant for encapsulating the chip, the first conductive bumps, the second conductive bumps and the leadframe, wherein a bottom surface of each of the leads and a bottom end of each of the second conductive bumps are exposed from the encapsulant. The bottom ends of the second conductive bumps may be exposed by performing a grinding process on the encapsulant and the bottom surfaces of the leads, such that the second conductive bumps act as additional electrical connections for the semiconductor package.

As such, the chip can be electrically connected to the external device via the first conductive bumps and the leads of the leadframe, and may further be electrically connected directly to the external device by the second conductive bumps, such that the number of electrical connections for the semiconductor package is increased by means of the second conductive bumps. The additional electrical connections provided by the second conductive bumps implanted to the second region of the active surface of the chip not only may serve as grounding or power connections but also may function as signal I/O connections for the chip, thereby desirably increasing the number of I/O connections for the semiconductor package. This solves the problem of not able to increase the number of I/O connections as in the prior art.

Further, the chip in the semiconductor package may have a redistribution layer for redistributing bond pads of the chip to the first and second regions of the active surface of the chip, such that the first conductive bumps can be implanted to the first region of the active surface of the chip and the second conductive bumps can be implanted to the second region of the active surface of the chip, so as to desirably increase the overall number of I/O connections for the semiconductor package.

Moreover, besides the plurality of leads, the leadframe of the semiconductor package can also comprise a conductive pad (die pad), such that a portion of the second conductive bumps implanted to the second region of the chip can be attached to and electrically connected to the conductive pad to serve as grounding or power connections. The rest of the second conductive bumps, which are not attached to the conductive pad, are exposed from the encapsulant and serve as I/O connections.

The present invention also proposes a fabrication method of the foregoing leadframe-based semiconductor package, comprising the steps of: preparing a leadframe and a chip, the leadframe having a plurality of leads and the chip having an active surface defined with a first region and a second region surrounded by the first region, wherein a plurality of first conductive bumps are implanted on the first region of the active surface of chip and a plurality of second conductive bumps are implanted on the second region of the active surface of the chip; attaching and electrically connecting the first conductive bumps on the chip to the corresponding leads of the leadframe; forming an encapsulant to encapsulate the chip, the first and second conductive bumps and the leadframe; and performing a grinding process on the encapsulant and bottom surfaces of the leads so as to expose the second conductive bumps from the encapsulant.

The above fabrication method of the semiconductor package further comprises: forming a redistribution layer on the active surface of the chip, for redistributing bond pads of the chip to the first region and the second region of the chip. This allows the bond pads, if not disposed at proper positions on the chip originally, to be redistributed to the proper positions where the first conductive bumps can be implanted to the first region of the chip and correspond in position to the leads and the second conductive bumps can be implanted to the second region of the chip and subsequently exposed from the encapsulant to serve as additional I/O connections for the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package and a fabrication method thereof as proposed in the present invention are described as follows with reference to FIGS. 3A to 3B, 4A to 4F and 5A to 5B.

The following embodiments are exemplified by a Flip-Chip Quad Flat Non-Leads (FC-QFN) semiconductor package and a fabrication method thereof. It should be understood that the drawings are simplified schematic diagrams only showing the elements relevant to the present invention, and the layout of elements could be more complicated in practical implementation.

First Preferred Embodiment

Figure 3A:
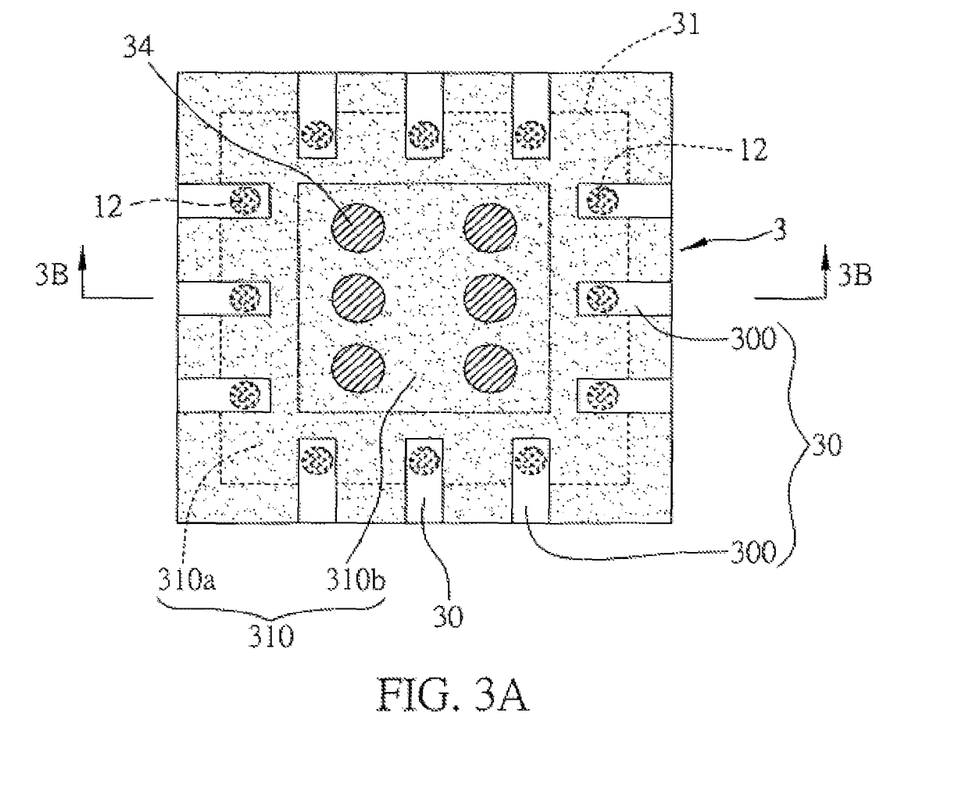
FIG. 3A is a plane view of a semiconductor package according to a first preferred embodiment of the present invention.
Figure 3B:
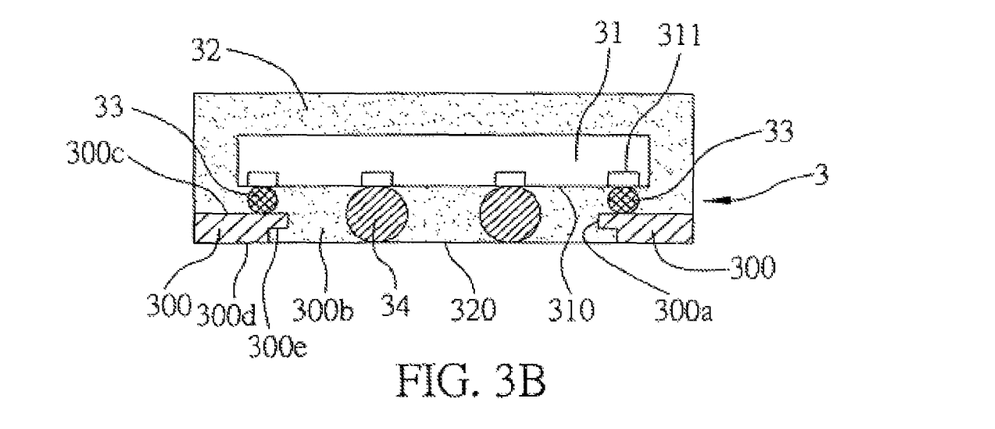
FIG. 3B is a cross-sectional view of the semiconductor package of FIG. 3A taken along line 3B-3B.

FIGS. 3A and 38 are respectively a plan view and a cross-sectional view of a semiconductor package 3 according to a first preferred embodiment of the present invention. As shown in FIGS. 3A and 38, the semiconductor package 3 comprises: a leadframe 30, a chip 31 mounted on the leadframe 30, and an encapsulant 32 for encapsulating the leadframe 30 and the chip 31. The leadframe 30 comprises a plurality of leads 300, wherein an inner end 300a of each of the leads 300 is directed toward a center of the leadframe 30, and the inner ends 300a of the leads 300 define and surround a spacing 300b. Each of the leads 300 further has a top surface 300c and an opposite bottom surface 300d. The leadframe 30 may be made of a metallic material, such as copper or an alloy thereof. The leadframe 30 can be formed by any suitable conventional method such as punching, etching, or the like.

The chip 31 has an active surface 310 on which a redistribution layer (RDL, not shown) is formed. The redistribution layer is used to redistribute a plurality of electrical connections such as bond pads 311 on the chip 31 to desirable positions on the active surface 310. As the formation of the redistribution layer is conventional and well known to persons skilled in the art, detailed description thereto and physical indication thereof in the drawings are herein omitted. The active surface 310 of the chip 31 is further defined with a first region 310a (e.g. a peripheral region as shown) and a second region 310b (e.g. a central region as shown) surrounded by the first region 310a, such that a portion of the bond pads 311 are positioned within the first region 310a and the rest of the bond pads 311 are positioned within the second region 310b.

A plurality of first conductive bumps 33, for serving as I/O connections for the chip 31, are implanted to the corresponding bond pads 311 located within the first region 310a of the active surface 310 of the chip 31, such that when the chip 31 is mounted on the leadframe 30, each of the first conductive bumps 33 is bonded to the top surface 300c of a corresponding one of the leads 300. Accordingly, the chip 31 is electrically connected to the leads 300 of the leadframe 30 by the first conductive bumps 33.

In addition to the first conductive bumps 33, a plurality of second conductive bumps 34 are implanted to the corresponding bond pads 311 located within the second region 310b and are received in the spacing 300b of the leadframe 30. The second conductive bumps 34 are used for serving as power connections, grounding connections, heat-dissipating connections, and/or I/O connections for the chip 31, such that the chip 31 can be directly electrically connected to an external device, such as a printed circuit board (not shown), by the second conductive bumps 34. In order to establish the direct connection relationship with the external device, the second conductive bumps 34 are required to be exposed from the encapsulant 32. Accordingly, an exposed portion (e.g. a bottom end) of each of the second conductive bumps 34 is made to be flush with the bottom surfaces 300d of the leads 300 and a lower surface 320 of the encapsulant 32. This thus allows the exposed portions of the second conductive bumps 34 and the bottom surfaces 300d of the leads 300 to be electrically connected to the external device in a coplanar manner.

Further, the height of each of the second conductive bumps 34 has to be greater than that of each of the first conductive bumps 33, so as for the second conductive bumps 34 to be exposed from the encapsulant 32. That is, the height of each of the second conductive bumps 34 has to be equal to the sum of the height of each of the first conductive bumps 33 and the thickness of each of the leads 300.

Also, for the sake of further enhancing the bonding strength between the leadframe 30 and the encapsulant 32, the inner end 300a of each of the leads 300 may additionally be etched or punched from the bottom surface 300d to form a recess 300e. Thus, the leads 300 can be anchored into the encapsulant 32 by allowing the encapsulant 32 to fill the recesses 300e of the leads 300.

It is thus clear that the semiconductor package 3 of the present invention, with provision of the second conductive bumps 34 bonded to the chip 31, has an increased number of I/O connections than that of the prior art, such that the electrical performance of the semiconductor package 3 is enhanced.

The semiconductor package 3 of the present invention can be fabricated by a method shown in FIGS. 4A to 4F.

Figure 4A:
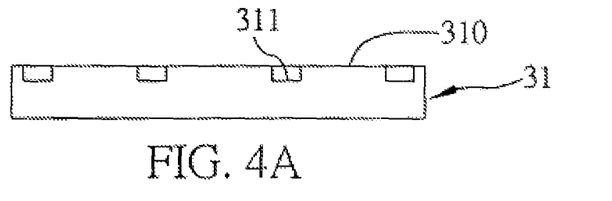
FIGS. 4A to 4F are schematic diagrams showing the steps of a fabrication method of the semiconductor package according to the first preferred embodiment of the present invention.
Figure 4B:
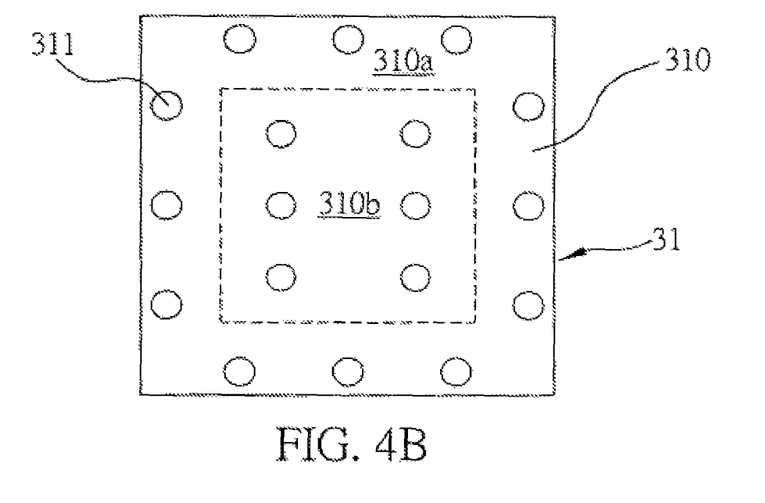
Figure 4C:
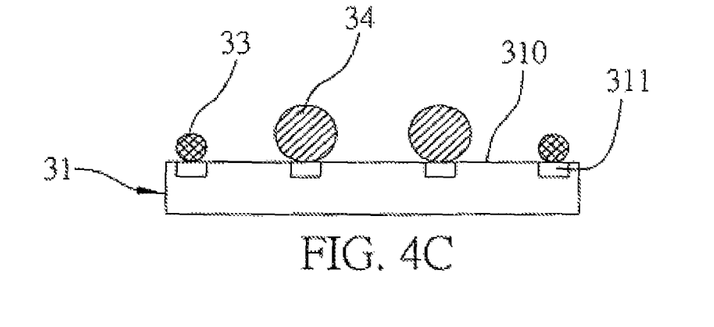

As shown in FIGS. 4A and 4B, a semiconductor chip 31 having an active surface 310 is prepared. A plurality of bond pads 311, such as I/O connections, power connections, grounding connections and so on, are formed on the active surface 310 of the chip 31. The active surface 310 is defined with a first region 310a and a second region 310b surrounded by the first region 310a, wherein a portion of the bond pads 311 are disposed within the first region 310a and the rest of the bond pads 311 are disposed within the second region 310b by means of a redistribution technology. As shown in FIG. 4C, a plurality of first conductive bumps 33 are implanted on the bond pads 311 formed in the first region 310a of the active surface 310 of the chip 31 to serve as I/O connections for the chip 31, and a plurality of second conductive bumps 34 are implanted on the bond pads 311 formed in the second region 310b of the active surface 310 of the chip 31 to serve as electrical connections such as power connections, grounding connections and/or I/O connections. The height of each of the second conductive bumps 34 is greater than that of each of the first conductive bumps 33.

Figure 4D:
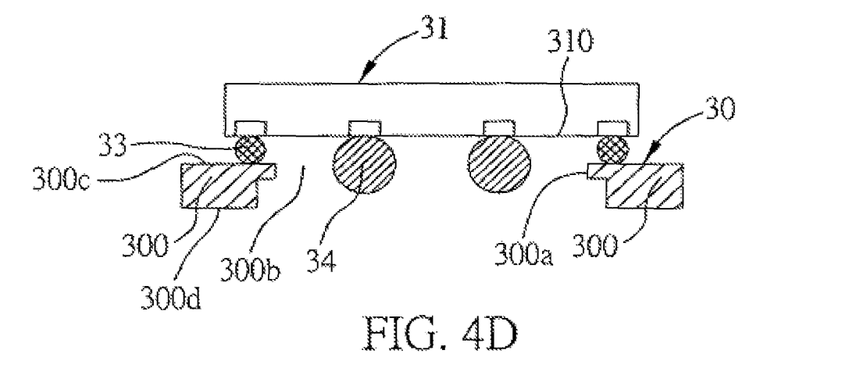
Figure 4E:
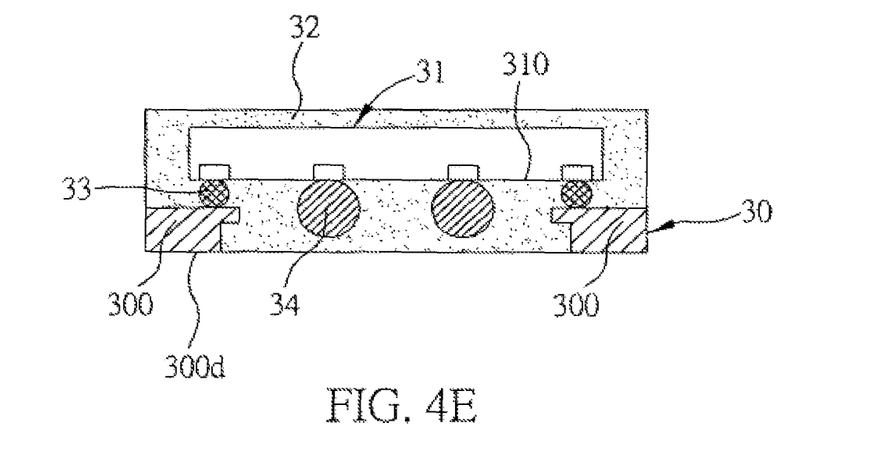

As shown in FIG. 4D, a leadframe 30, which can be made of copper or an alloy thereof, is provided. The leadframe 30 comprises a plurality of leads 300, wherein each of the leads 300 has an inner end 300a directed toward a center of the leadframe 30, with a spacing 300b being defined and surrounded by the inner ends 300a of the leads 300. Further, each of the leads 300 has a top surface 300c and an opposite bottom surface 300d. The chip 31 is mounted to the leadframe 30 by having each of the first conductive bumps 33 bonded to the top surface 300c of a corresponding one of the leads 300. As shown in FIG. 4E, an encapsulant 32 is formed for encapsulating the chip 31, the first conductive bumps 33, the second conductive bumps 34 and the leadframe 30, with the bottom surfaces 300d of the leads 300 being exposed from the encapsulant 32.

Figure 4F:
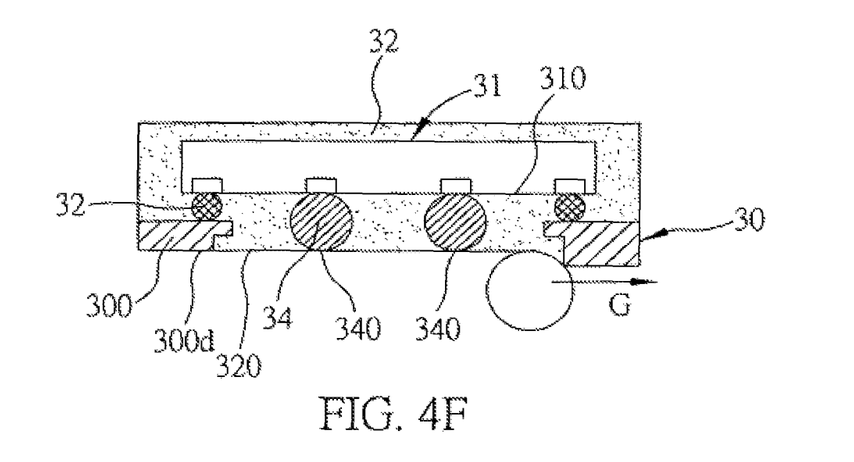

As shown in FIG. 4F, a grinding process is carried out to grind the bottom surfaces 300d of the leads 300 and a lower surface 320 of the encapsulant 32 until a desired portion (e.g. a bottom end 340) of each of the second conductive bumps 34 is exposed from the encapsulant 32. By such processing, the bottom ends 340 of the second conductive bumps 34 are flush with the bottom surfaces 300d of the leads 300 and the lower surface 320 of the encapsulant 32. This thus completes the fabrication of the semiconductor package 3 shown in FIGS. 3A and 3B. Since the grinding process is performed, the final thickness of the fabricated semiconductor package 3 can be reduced to a desired extent.

The foregoing fabrication method of the semiconductor package of the present invention may optionally comprise a step of plating the bottom surfaces 300d of the leads 300 with a solder layer (not shown) following the completion of the grinding process, such that the semiconductor package 3 can be electrically connected to an external device such as a printed circuit board via the solder layer and the second conductive bumps 34 exposed from the encapsulant 32.

Second Preferred Embodiment

Figure 5A:
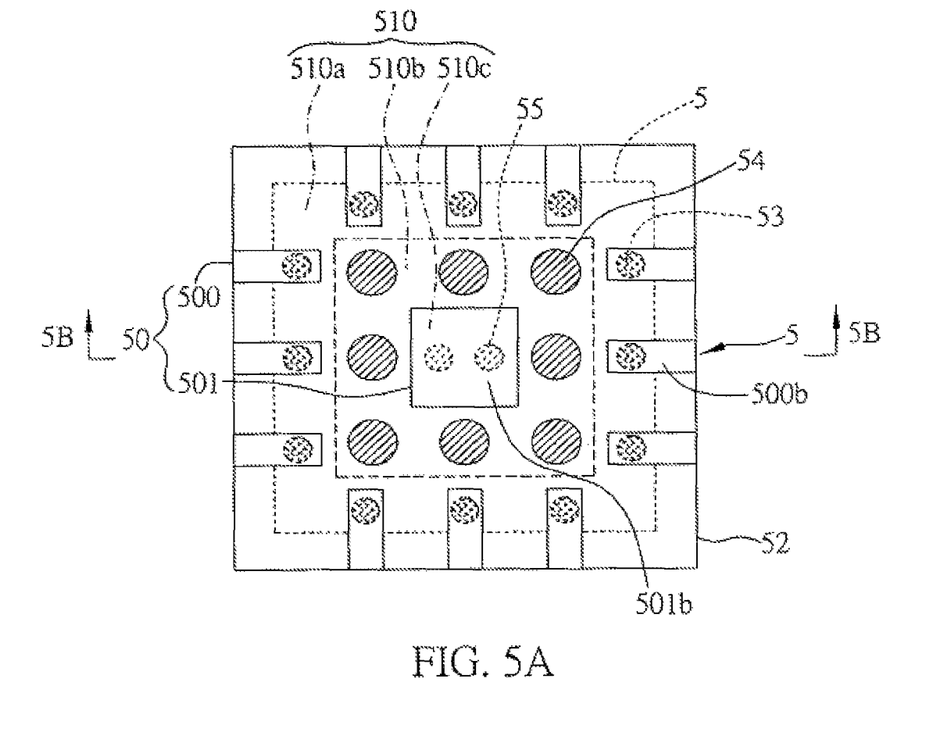
FIG. 5A is a plane view of a semiconductor package according to a second preferred embodiment of the present invention.
Figure 5B:
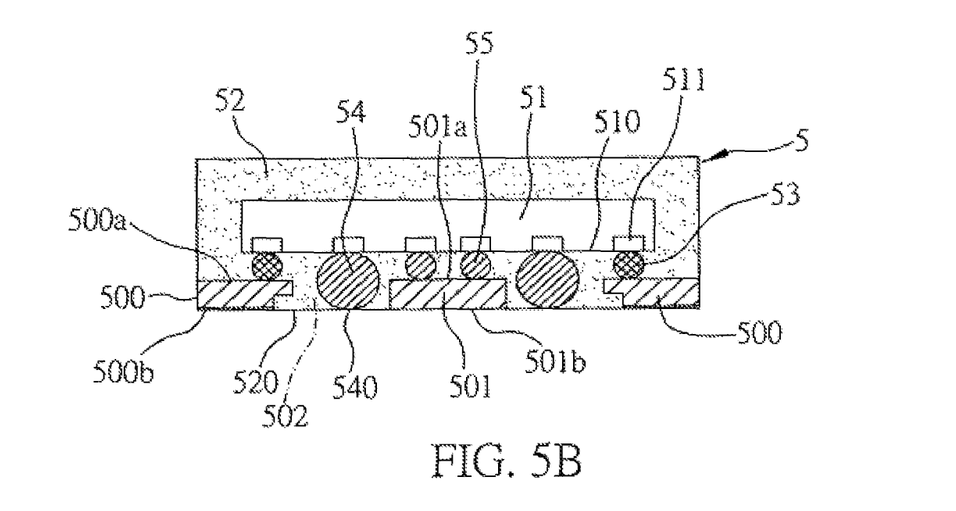
FIG. 5B is a cross-sectional view of the semiconductor package of FIG. 5A taken along line 5B-5B.

FIGS. 5A and 5B are respectively a plane view and a cross-sectional view of a semiconductor package according to a second preferred embodiment of the present invention. The semiconductor package of the second embodiment is similar to that of the first embodiment, with a primary difference in that the leadframe further comprises at least one conductive pad (die pad) formed in a central portion of the leadframe and spaced apart from a plurality of leads formed in a peripheral portion of the leadframe.

Particularly, as shown in FIGS. 5A and 5B, the semiconductor package 5 of the second embodiment comprises: a leadframe 50, a chip 51 attached to the leadframe 50, and an encapsulant 52 for encapsulating the leadframe 50 and the chip 51. The leadframe 50 includes a plurality of leads 500, and a die pad 501 spaced apart from and surrounded by the plurality of leads 500. Each of the leads 500 has a top surface 500a and an opposite bottom surface 500b, and the die pad 501 has a top surface 501a and an opposite bottom surface 501b. And between the leads 500 and the die pad 501 there is formed a spacing 502 with a predetermined width.

The chip 51 has an active surface 510, wherein the active surface 510 is defined with a first region 510a, a second region 510b within the first region 510a, and a third region 510c within the second region 510b. A plurality of bond pads 511 are formed on the active surface 510 and disposed within the first region 510a, the second region 510b, and the third region 510c. By such arrangement, a plurality of first conductive bumps 53 can be implanted on the bond pads 511 located within the first region 510a, a plurality of second conductive bumps 54 can be implanted on the bond pads 511 located within the second region 510b, and a plurality of third conductive bumps 55 can be implanted on the bond pads 511 located within the third region 510c. The chip 51 is attached to the leadframe 50 via the active surface 510 in a manner that the first conductive bumps 53 are bonded to the top surfaces 500a of the leads 500, the second conductive bumps 54 are received in the spacing 502, and the third conductive bumps 55 are bonded to the top surface 501a of the die pad 501. Thus, the chip 51 is electrically connected to the leadframe 50 by the first conductive bumps 53 and the third conductive bumps 55.

The second conductive bumps 54 are greater in height than the first and third conductive bumps 53, 55 respectively, such that subsequent to the formation of the encapsulant 52, bottom ends 540 of the second conductive bumps 54 are exposed from the encapsulant 52 and are used to electrically connect the chip 51 to an external device such as a printed circuit board. Likewise, the bottom surfaces 500b of the leads 500 and the bottom surface 501b of the die pad 501 are also exposed from the encapsulant 52 and are coplanar with the bottom ends 540 of the second conductive bumps 54. Thus, the die pad 501 may act as a power connection, a grounding connection and/or a heat-dissipating connection for the chip 51, and the second conductive bumps 54 may act as I/O connections for the chip 51. As such, desired multi-functionality, electrical performance and heat dissipating efficiency for the semiconductor package 5 can be achieved.

The invention has been described using exemplary preferred embodiments. However, it is to be understood that the scope of the invention is not limited to the disclosed embodiments. On the contrary, it is intended to cover various modifications and similar arrangements. For example, a non-active surface of the chip opposing to the active surface thereof may be exposed from an upper surface of the encapsulant opposing to the lower surface thereof, allowing the exposed non-active surface of the chip to be optionally adhered to a heat spreader in order to enhance the heat dissipating performance of the semiconductor package. The scope of the claims, therefore, should be accorded the broadest interpretation so as to encompass all such modifications and similar arrangements.

What is claimed is:

1. A fabrication method of a leadframe-based semiconductor package, comprising the steps of:

preparing a leadframe and a chip, the lead frame having a plurality of leads, and the chip having an active surface defined with a first region and a second region surrounded by the first region, wherein a plurality of first conductive bumps are attached to the first region of the active surface of the chip and a plurality of second conductive bumps are attached to the second region of the active surface of the chip;

bonding the first conductive bumps to top surfaces of the leads so as to electrically connect the chip to the leadframe;

forming an encapsulant to encapsulate the chip, the first and second conductive bumps and the leadframe, wherein bottom surfaces of the leads and bottom ends of the second conductive bumps are exposed from the encapsulant and are flush with a lower surface of the encapsulant; and plating a solder layer on the bottom surfaces of the leads.

2. The fabrication method of claim 1, prior to plating the solder layer on the bottom surfaces of the leads, further comprising performing a grinding process on the bottom surfaces of the leads and the lower surface of the encapsulant, so as to reduce a thickness of the leadframe-based semiconductor package.

3. The fabrication method of claim 1, wherein the chip is electrically connected to the leadframe by a flip-chip process.

4. The fabrication method of claim 1, wherein the first conductive bumps serve as I/O connections for the chip.

5. The fabrication method of claim 1, wherein the second conductive bumps serve as power connections, grounding connections, heat-dissipating connections and/or I/O connections for the chip.

6. The fabrication method of claim 1, wherein the second conductive bumps are greater in height than the first conductive bumps.

7. The fabrication method of claim 1, wherein the leadframe further comprises a die pad surrounded by and spaced from the leads, and the active surface of the chip is further defined with a third region located within the second region, allowing a plurality of third conductive bumps to be attached to the third region of the chip and electrically connected to the die pad.

8. The fabrication method of claim 7, wherein a bottom surface of the die pad is exposed from the encapsulant and is flush with the bottom ends of the second conductive bumps and the bottom surfaces of the leads.

9. The fabrication method of claim 7, wherein the second conductive bumps serve as I/O connections for the chip, and the third conductive bumps serve as power connections, grounding connections and/or heat-dissipating connections for the chip.

* * * * *